(12) United States Patent
Fong et al.

(10) Patent No.: US 9,577,176 B1
(45) Date of Patent: Feb. 21, 2017

(54) JOSEPHSON JUNCTION READOUT FOR GRAPHENE-BASED SINGLE PHOTON DETECTOR

(71) Applicant: RAYTHEON BBN TECHNOLOGIES CORP., Cambridge, MA (US)

(72) Inventors: Kin Chung Fong, Lexington, MA (US); Thomas A. Ohki, Arlington, MA (US)

(73) Assignee: RAYTHEON BBN TECHNOLOGIES CORP., Cambridge, MA (US)

( * ) Notice: Subject to any disclaimer, the term of this patent is extended or adjusted under 35 U.S.C. 154(b) by 0 days.

(21) Appl. No.: 14/846,013

(22) Filed: Sep. 4, 2015

Related U.S. Application Data

(60) Provisional application No. 62/181,195, filed on Jun. 18, 2015.

(51) Int. Cl.
*H01L 39/22* (2006.01)
*G01J 1/42* (2006.01)
*G01J 1/44* (2006.01)

(52) U.S. Cl.
CPC ............ *H01L 39/223* (2013.01); *G01J 1/4257* (2013.01); *G01J 1/44* (2013.01); *G01J 2001/442* (2013.01); *G01J 2001/4446* (2013.01)

(58) Field of Classification Search
CPC .................. H01L 39/22; G01J 1/42; G01J 1/44
See application file for complete search history.

(56) References Cited

U.S. PATENT DOCUMENTS

| | | | |
|---|---|---|---|
| 5,155,093 A * | 10/1992 | Den | G01J 1/42 250/214.1 |
| 7,723,684 B1 | 5/2010 | Haddon et al. | |
| 8,436,305 B1 | 5/2013 | Sood et al. | |
| 8,916,825 B1 * | 12/2014 | Egerton et al. | 250/338.4 |
| 9,105,793 B2 * | 8/2015 | Bouchiat et al. | |
| 9,196,766 B1 | 11/2015 | Egerton et al. | |
| 2008/0251723 A1 | 10/2008 | Ward et al. | |
| 2009/0233798 A1* | 9/2009 | Maeda et al. | 505/190 |

(Continued)

FOREIGN PATENT DOCUMENTS

JP 2004286715 A * 10/2004

OTHER PUBLICATIONS

Bozzi et al., "Current and Future Research Trends in Substrate Integrated Waveguide Technology," Radioengineering, 18(2):201-209, Jun. 2009.

(Continued)

*Primary Examiner* — Marcus Taningco
(74) *Attorney, Agent, or Firm* — Lewis Roca Rothgerber Christie LLP

(57) ABSTRACT

A detector for detecting single photons of infrared radiation. In one embodiment a waveguide configured to transmit infrared radiation is arranged to be adjacent a graphene sheet and configured so that evanescent waves from the waveguide overlap the graphene sheet. An infrared photon absorbed by the graphene sheet from the evanescent waves heats the graphene sheet. The graphene sheet is coupled to the weak link of a Josephson junction, and a constant bias current is driven through the Josephson junction, so that an increase in the temperature of the graphene sheet results in a decrease in the critical current of the Josephson junction and a voltage pulse in the voltage across the Josephson junction. The voltage pulse is detected by the pulse detector.

20 Claims, 8 Drawing Sheets

(56) References Cited

U.S. PATENT DOCUMENTS

| | | | |
|---|---|---|---|
| 2013/0342279 A1 | 12/2013 | Sensale-Rodriguez et al. | |
| 2014/0056551 A1* | 2/2014 | Liu et al. | 385/2 |
| 2014/0103213 A1 | 4/2014 | Maliakal et al. | |
| 2015/0109606 A1 | 4/2015 | Peale et al. | |
| 2016/0370232 A1 | 12/2016 | Fong | |
| 2016/0372622 A1 | 12/2016 | Fong et al. | |

OTHER PUBLICATIONS

Castellanos-Beltran et al., "Widely tunable parametric amplifier based on a superconducting quantum interference device array resonator," Applied Physics Letters, 91, 083509, 3 pages, 2007.
CITLF3, Cryogenic SiGe Low Noise Amplifier, 4 pages, Mar. 11, 2014.
CITCRY04-12A, Cryogenic HEMT Low Noise Amplifier, 3 pages, Oct. 13, 2010.
Crossno et al., "Development of high frequency and wide bandwidth Johnson noise thermometry," Applied Physics Letters, 106, 023121, 4 pages, 2015.
Eom et al., "A wideband, low-noise superconducting amplifier with high dynamic range," Nature Physics, 8:623-627, Aug. 2012.
Fong et al., "Measurement of the Electronic Thermal Conductance Channels and Heat Capacity of Graphene at Low Temperature," Physical Review X, 3, 041008, 7 pages, 2013.
Fong et al., "Measurement of the Electronic Thermal Conductance Channels and Heat Capacity of Graphene at Low Temperature," Applied Physics, California Institute of Technology, 7 page, 2013.
Fong et al., "Ultrasensitive and Wide-Bandwidth Thermal Measurements of Graphene at Low Temperatures," Physical Review X, 2, 031006, 8 pages, 2012.
Fong et al., "Ultrasensitive and Wide-Bandwidth Thermal Measurements of Graphene at Low Temperatures," Applied Physics, California Institute of Technology, 18 pages, Jul. 24, 2012.
Karasik et al., "Normal-Metal Hot-Electron Nanobolometer With Johnson Noise Thermometry Readout," IEEE Trans. on Terahertz Sci. and Tech., 6 pages, 2014.
Lee et al., "Fabrication of ultralow-loss Si/SiO$_2$ waveguides by roughness reduction," Optics Letters, 26(23):1888-1890, Dec. 1, 2001.
McKitterick et al., "Performance of graphene thermal photon detectors," Journal of Applied Physics, 113, 044512, 6 pages, 2013.
Mück et al., "Superconducting quantum interference device as a near-quantum-limited amplifier at 0.5 Ghz," Applied Physics Letters, 78(7):967-969, Feb. 12, 2001.
Soltani, "Novel Integrated Silicon Nanophotonics Structures using Ultra-high Q Resonators," School of Electrical and Computer Engineering, Georgia Institute of Technology, 425 pages, Dec. 2009.
Wang et al., "One-Dimensional Electrical Contact to a Two-Dimensional Material," Science, 342:614-617, Nov. 1, 2013.
Yan et al., "Dual-gated bilayer graphene hot-electron bolometer," Nature Nanotechnology, 7:472-478, Jul. 2012.
Vicarelli, et al., "Graphene Field-Effect Transistors As Room-Temperature Terahertz Detectors", Nature Materials, Advance Online Publication, Published Sep. 9, 2012, (pp. 1-7).

Walsh, et al., "Detecting Single Photons By Graphene-Based Josephson Junctions", Department of Electrical Engineering and Computer Science, Massachusetts Institute of Technology, Cambridge, MA, Dated Mar. 8, 2016 (10 pgs.).
International Search Report from related International Application No. PCT/US2016/016346, International Search Report dated Apr. 28, 2016 and mailed Jul. 11, 2016 (6 pgs.).
Written Opinion of the International Searching Authority from related International Application No. PCT/US2016/016438, mailed Jul. 11, 2016 (9 pgs.).
Avouris, et al., "Graphene Photonics, Plasmonics, and Optoelectronics", IEEE Journal of Selected Topics in Quantum Electronics, vol. 20, No. 1, Jan. 1, 2014, p. 6000112 (12 pgs.).
Gan, et al., "Chip-Integrated Ultrafast Graphene Photodetector With High Responsivity", Nature Photonics, vol. 7, No. 11, Sep. 15, 2013 (pp. 883-887).
Karasik, et al., "Monolayer Graphene Bolometer As A Sensitive Far-IR Detector", Optomechatronic Micro/Nano Devices And Components III: Oct. 8-10, 2007, vol. 9153, Jul. 23, 2014, (pp. 915309-1-915309-9).
Invitation to Pay Additional Fees in related International Patent Application No. PCT/US2016/016436, filed Feb. 3, 2016, Invitation to Pay Additional Fees mailed May 6, 2016 (7 pgs).
Du, et al., "Graphene-based Bolometers" Graphene and 2D Materials, Aug. 1, 2013 URL:https://arxiv.org/ftp/arxiv/papers/1308/1308.4065.pdf (50 pgs.).
Du, et al. "Graphene-based Bolometers", Graphene and 2D Materials, vol. 1, No. 1, Jan. 1, 2014. pp. 1-22.
Koester, et al., "Waveguide-Coupled Graphene Optoelectronics" IEEE Journal of Selected Topics in Quantum Electronics, vol. 20, No. 1, Jan./Feb. 2014 (11 pgs.).
McKitterick, et al., "Performance of Graphene Thermal Photon Detectors" Journal of Applied Physics, vol. 113, No. 4, Jan. 28, 2013 (pp. 044512-1 to 044512-6).
McKitterick, et al. "Ultrasensitive graphene far-infrared power detectors", Journal of Physics: Condensed Matter, Institute of Physics Publishing, Bristol, GB, vol. 27, No. 16, Apr. 2, 2015 (13 pgs.).
International Search Report from corresponding International Application NO. PCT/US2016/027946, dated Jul. 15, 2016 and mailed Oct. 10, 2016 (5 pgs.).
Written Opinion of the International Searching Authority from corresponding International Application No. PCT/US2016/027946, mailed Oct. 10, 2016 (7 pgs.).
Koppens et al., "Photodetectors based on graphene, other two-dimensional materials and hybrid systems", Oct. 2014, Nature Nanotechnology, vol. 9, pp. 780-793. doi:10.1038/NNANO.2014.215.
Liu et al., "A graphene-based broadband optical modulator", Jun. 2, 2011, vol. 474, pp. 64-67. doi:10.1038/nature10067.
Xu et al., "Photo-Thermoelectric Effect at a Graphene Interface Junction", Nov. 10, 2009, American Chemical Society, vol. 10, pp. 562-566. doi:10.1021/nl903451y.
Xia et al., "Ultrafast graphene photodetector", Dec. 2009, Naute Nanotechnology, vol. 4, pp. 839-843. doi:10.1038/NNANO.2009.292.

* cited by examiner

JOSEPHSON JUNCTION READOUT FOR GRAPHENE-BASED SINGLE PHOTON DETECTOR

CROSS-REFERENCE TO RELATED APPLICATION(S)

The present application claims priority to and the benefit of U.S. Provisional Application No. 62/181,195, filed Jun. 18, 2015, entitled "JOSEPHSON JUNCTION READOUT FOR GRAPHENE-BASED SINGLE PHOTON DETECTOR", the entire content of which is incorporated herein by reference.

BACKGROUND

1. Field

One or more aspects of embodiments according to the present invention relate to detection of photons, and more particularly to a detector for detecting individual photons of infrared light using a waveguide coupled to a graphene sheet, coupled, in turn, to a Josephson junction.

2. Description of Related Art

Detectors capable of detecting single photons have multiple applications, including applications in quantum communications. Such detectors, for high-energy photons, may be constructed according to a variety of designs. For low energy photons, such as photons with wavelengths of 1 micron or more, however, there is a gap in detector technology. In particular, existing communications systems may use a wavelength of 1550 nm, and other components, such as lasers, designed to operate at this wavelength may be readily available, resulting in applications for detectors operating at the same wavelength. Thus, there is a need for a single-photon detector for low-energy photons.

SUMMARY

Aspects of embodiments of the present disclosure are directed toward a detector for detecting single photons of infrared radiation. In one embodiment a waveguide configured to transmit infrared radiation is arranged to be adjacent a graphene sheet and configured so that evanescent waves from the waveguide overlap the graphene sheet. An infrared photon absorbed by the graphene sheet from the evanescent waves heats the graphene sheet. Part of the graphene sheet is part of the Josephson junction as the weak link, and a constant bias current is driven through the Josephson junction; an increase in the temperature of the graphene sheet results in a decrease in the critical current of the Josephson junction and a voltage pulse in the voltage across the Josephson junction. The voltage pulse is detected by the pulse detector.

According to an embodiment of the present invention there is provided a photon detector including: a graphene sheet; a waveguide adjacent the graphene sheet, the waveguide configured to guide infrared electromagnetic waves in a mode having an evanescent field coupled to the graphene sheet, to produce an increase in a temperature of the graphene sheet when a photon of the evanescent field is absorbed by the graphene sheet; a Josephson junction on the graphene sheet, the Josephson junction having a gap coupled to electrons of the graphene sheet; and a circuit connected to two contacts of the Josephson junction, the circuit configured to detect a decrease in a critical current of the Josephson junction, the decrease corresponding to the increase in the temperature of the graphene sheet.

In one embodiment, the graphene sheet has an electron mobility of more than 100,000 $cm^2/V/s$.

In one embodiment, the graphene sheet has an electron mobility of about 1,000 $cm^2/V/s$.

In one embodiment, the graphene sheet substantially has the shape of a rectangle, the rectangle having a length and a width, the length being greater than or equal to the width.

In one embodiment, the length of the rectangle is less than 20 microns.

In one embodiment, the product of the length of the rectangle and the width of the rectangle is less than 1000 square microns.

In one embodiment, the waveguide has a curved section, the curved section having a radius of curvature less than the length of the rectangle, the curved section resulting in a change of direction of the waveguide of at least 45 degrees.

In one embodiment, the waveguide includes a reflector.

In one embodiment, the waveguide is on a substantially flat substrate, in a layer on a surface of the substrate, the layer having a thickness greater than 10 nanometers and less than 2 microns.

In one embodiment, the photon includes a first layer of hexagonal boron nitride immediately adjacent a first surface of the graphene sheet, and a second layer of hexagonal boron nitride immediately adjacent a second surface of the graphene sheet.

In one embodiment, each of the first layer of hexagonal boron nitride and the second layer of hexagonal boron nitride has a thickness greater than 4 nm and less than 40 nm.

In one embodiment, the circuit includes a current source connected to the two contacts of the Josephson junction and configured to drive a constant bias current through the Josephson junction.

In one embodiment, the photon includes an amplifier connected to the two contacts of the Josephson junction.

In one embodiment, the photon includes a matching circuit connected between the two contacts and the amplifier.

In one embodiment, the photon includes a pulse detector connected to the amplifier, the pulse detector including a voltage reference and a comparator configured to compare the output of the amplifier to the output of the voltage reference.

In one embodiment, the graphene sheet consists of a single atomic layer of graphene.

In one embodiment, the graphene sheet includes two atomic layers of graphene.

In one embodiment, the photon includes a refrigerator configured to cool the graphene sheet to a temperature below 4 K.

In one embodiment, the refrigerator is a pulse tube refrigerator.

In one embodiment, the refrigerator is a Gifford-McMahon cooler.

BRIEF DESCRIPTION OF THE DRAWINGS

Features, aspects, and embodiments are described in conjunction with the attached drawings, in which.

DETAILED DESCRIPTION

The detailed description set forth below in connection with the appended drawings is intended as a description of exemplary embodiments of a Josephson junction readout for a graphene-based single photon detector provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Figure 1:
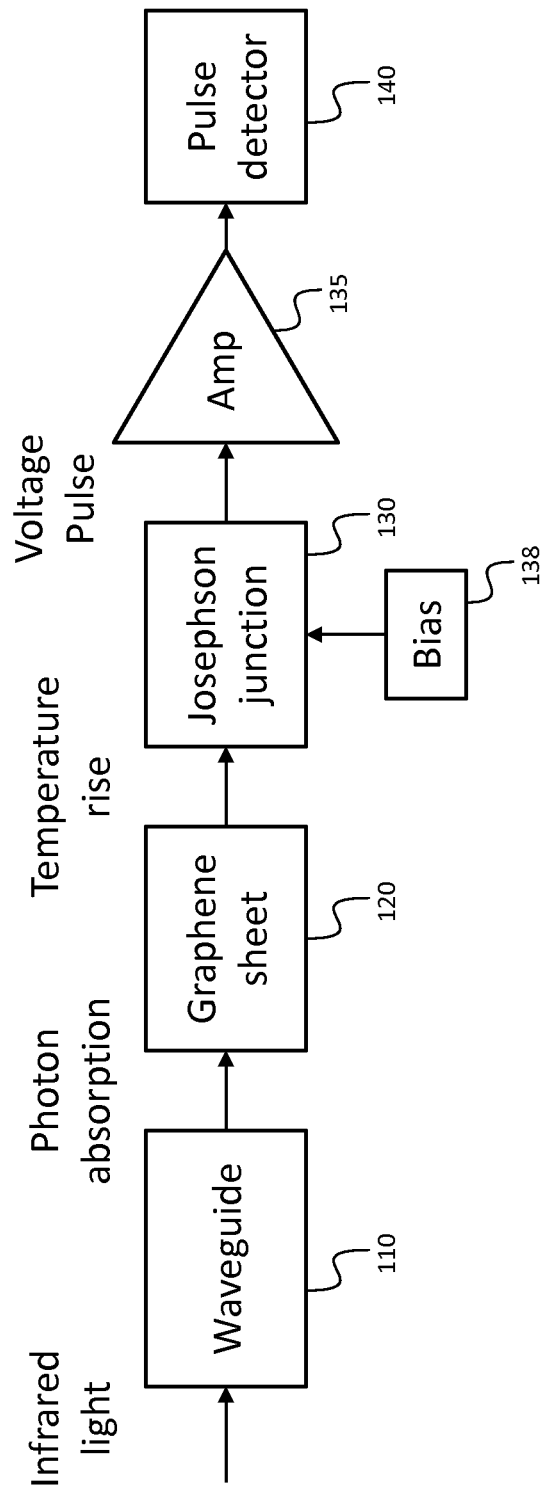
FIG. 1 is a block diagram of a single photon detector, according to an embodiment of the present invention.

Referring to FIG. 1, in one embodiment, a single-photon detector for infrared light includes an infrared waveguide 110, a graphene sheet 120, and a Josephson junction 130. The infrared waveguide 110, graphene sheet 120, and Josephson junction 130 form a sensor assembly, configured to receive photons, and to produce electrical signals when the photons are detected. In the sensor assembly, a photon may be absorbed by the graphene sheet 120 from the waveguide 110; the photon heats the graphene sheet 120, which is coupled to the Josephson junction 130, and the heating of the graphene sheet 120 causes a decrease in the critical current 310 of the Josephson junction 130. When the critical current 310 falls below a bias current 305 driven through the Josephson junction 130 from a bias circuit 138, the voltage across the Josephson junction 130 increases, i.e., a voltage pulse is produced. An amplifier 135 amplifies the voltage pulse, and a pulse detector 140 detects the voltage pulse. The combination of the Josephson junction 130, the bias circuit 138, the amplifier 135, and the pulse detector 140 forms a Josephson junction readout for detecting changes in the temperature of the graphene sheet 120.

Figure 2A:
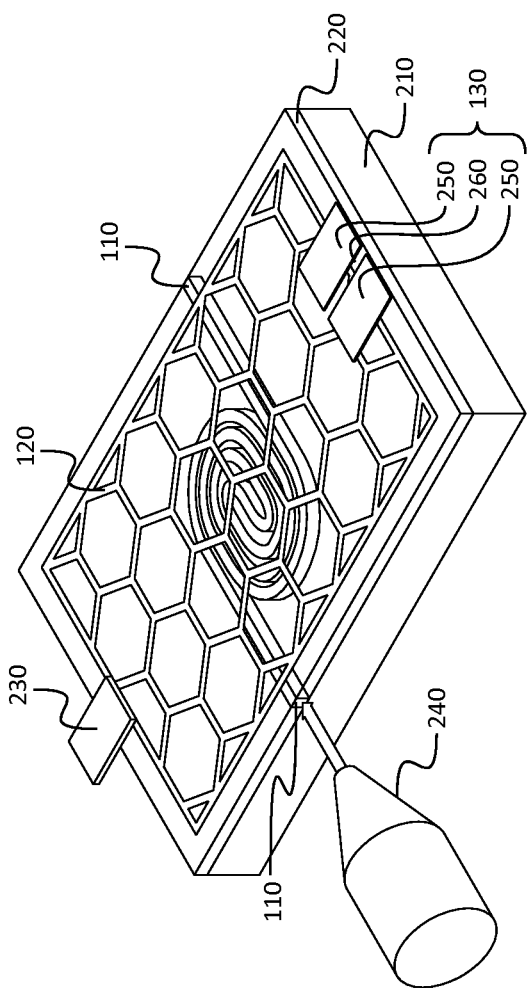
FIG. 2A is a perspective view of a sensor assembly, according to an embodiment of the present invention.

Referring to FIG. 2A, the waveguide 110 and the graphene sheet 120 of the sensor assembly may be fabricated as an integrated component on a substrate 210. When infrared electromagnetic waves propagate in the waveguide 110, evanescent waves outside the waveguide 110 overlap with, and couple to, the graphene sheet 120. This coupling allows photons of the electromagnetic waves to be absorbed by the graphene sheet 120, raising the temperature of the graphene sheet 120. When an infrared photon is absorbed by the graphene sheet 120, the absorption occurs primarily through interaction of the photon with the electronic degrees of freedom of the graphene sheet 120, the interactions between the photon and the nuclei of the graphene sheet 120 being significantly weaker. Electrons in the graphene sheet 120 are weakly coupled to phonons in the graphene sheet 120, and the total heat capacity of the electrons in the graphene sheet 120 is relatively small, so that the absorption of a photon results in a relatively large and rapid increase in the electron temperature. Moreover, the electrons in the graphene sheet 120 are strongly coupled to each other, and, as a result, the electron temperature within the graphene sheet 120 quickly becomes substantially uniform after the absorption of a photon. As used herein, the temperature of the graphene sheet 120 refers to the temperature of the electrons in the graphene sheet 120; immediately after the absorption of a photon, the electron temperature may differ from the phonon temperature.

The waveguide 110 may be fabricated by any of various methods known in the art for fabricating a waveguide 110 on the surface of a substrate 210. In one embodiment, a layer of silicon dioxide is formed on a silicon substrate 210, and patterned using photolithography to form the core of the waveguide 110 as a raised structure. A layer 220 of silicon nitride may then be formed over the waveguide 110 and the surrounding area, so that the waveguide 110 core has silicon nitride on both sides of it and above it. This structure may then be polished, so that the upper surface of the structure is flat and smooth. In other embodiments, the waveguide 110 may be formed by depositing a layer of silicon dioxide on a silicon substrate 210, depositing a layer of silicon on the silicon dioxide, and patterning the silicon layer using photolithography to form the waveguide 110 as a raised silicon structure. This structure may then be planarized, i.e., made flat and smooth, by depositing an additional layer of silicon dioxide and polishing it down to the top surface of the raised silicon structure. In other embodiments the waveguide 110 may be composed of another first material, surrounded by one or more other materials having a lower index of refraction than the first material. The resulting waveguide structure may have a thickness of between 50 nm and 2000 nm; in one embodiment it has a thickness of between 100 nm and 1000 nm. The transverse dimensions of the waveguide structure may be somewhat smaller or considerably smaller than the wavelength of the infrared light to be detected. The waveguide 110 may be single-mode or multi-mode when guiding light at the wavelength of the infrared light to be detected.

The substrate 210 may be substantially flat, e.g., within 1 micron of being flat over the area including the waveguide, and the waveguide may be formed, e.g., using one of the processes described above, in a layer having a thickness greater than 50 nanometers and less than 2 microns. The front end of the waveguide 110 may extend to the edge of the substrate 210 as shown, and off-chip coupling optics 240 may be used to launch infrared light into the waveguide 110. In other embodiments portions of the coupling optics 240 may be fabricated on the substrate 210. In some embodiments the waveguide 110 is omitted and infrared light propagating in free space illuminates the graphene sheet 120 directly.

The Josephson junction 130 may be composed of two adjacent superconducting patches 250, deposited on the substrate 210 at the edge of the graphene sheet 120, so as to overlap the edge of the graphene sheet 120. Each superconducting patch 250 may have a thickness in the range of 50 nm to 100 nm. The superconducting patches 250 may be separated by a small gap 260, having a width between 100 nm and 1 micron, e.g., 500 nm; this gap may act as a weak link. A diagnostic contact 230 may also be deposited on the substrate 210, at an opposite edge of the graphene sheet 120.

Electrons in the two superconducting patches 250 are coupled by tunneling across the gap 260. The Josephson junction 130 overlaps the edge of the graphene sheet 120, and electrons in the graphene sheet 120 couple to the gap 260 of the Josephson junction 130. The wave functions of electrons in the two superconducting patches 250 extend into the gap 260 and as a result are coupled to the electrons of the graphene sheet 120, the wave functions of which also extend into the gap 260. Because of this coupling, the temperature of the electrons of the graphene sheet 120 affects the critical current 310 (FIG. 3) of the Josephson junction 130; the higher the temperature of the electrons of the graphene sheet 120, the lower the critical current 310 of the Josephson junction 130. The superconducting patches 250 may be located on the graphene sheet 120 at a position that is separated (e.g., separated by at least 1 micron) from the waveguide 110 to avoid direction interaction of photons in the waveguide with the superconducting patches 250; such interaction may otherwise destroy the superconductivity of the superconducting patches 250. The superconducting patches 250 may be formed of any of a number of materials known in the art that become superconductive at low temperatures, including niobium nitride, niobium titanium nitride, niobium diselenide, aluminum, niobium, niobium titanium, or lead. The contacts formed between the superconducting patches 250 and the graphene sheet 120 may be highly transparent (i.e., they may have low contact resistance); each contact may be a one-dimensional (1D) contact along a respective edge of the graphene sheet 120, formed in a manner described in further detail below. The superconducting materials employed in the Josephson junction 130, and other design parameters of the Josephson junction 130 may be selected to form a Josephson junction 130 with a critical temperature of the order of (i.e., comparable to) the temperature change produced in the graphene sheet 120 by the absorption of a photon. The lateral dimensions of the superconducting patches 250 may be selected to be greater than the lateral extent of the Cooper pairs formed in the superconducting patches 250 when they are in a superconducting state.

Figure 3A:
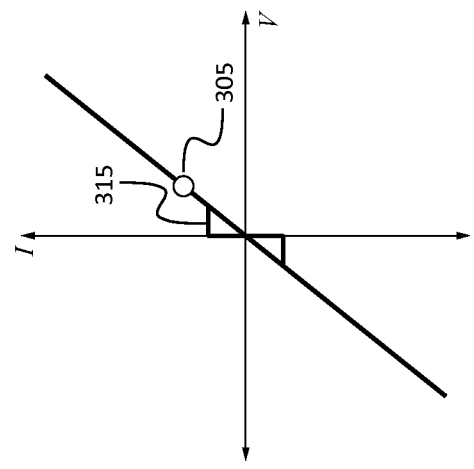
FIG. 3A is a graph of voltage across a Josephson junction and current flowing through the junction at a first temperature, according to an embodiment of the present invention.
Figure 3B:
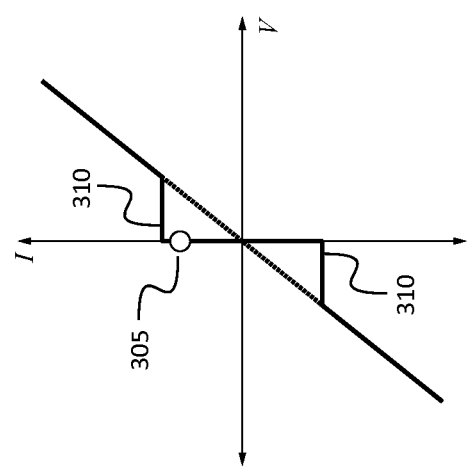
FIG. 3B is a graph of voltage across a Josephson junction and current flowing through the junction at a second temperature, higher than the first temperature, according to an embodiment of the present invention.

The two superconducting patches 250 of the Josephson junction 130 also serve as contacts. Conductors, e.g., gold wire or gold ribbon, may be bonded to the two superconducting patches 250 to connect the Josephson junction 130 to bias and readout circuitry. The bias and readout circuitry includes a bias circuit 138, configured as a current source, that drives a constant bias current 305 through the Josephson junction 130. The bias circuit 138 may include an operational amplifier 135 configured as a current source. Referring to FIG. 3A, the Josephson junction 130 has a current-voltage (I-V) curve with a superconducting portion corresponding to currents with a magnitude less than a critical current 310 within which the voltage across the Josephson junction 130 is zero. For currents exceeding the critical current 310, the voltage across the Josephson junction 130 is proportional to the current. The bias current 305 is selected to be less than the critical current 310 at the steady-state temperature of the graphene sheet 120 when no photons have been recently absorbed. Referring to FIG. 3B, when a photon is absorbed, the temperature increases, the critical current 310 decreases to a decreased critical current 315, and, if the decreased critical current 315 is less than the bias current 305, the voltage increases to a value proportional to the bias current 305.

After absorption of a photon, the temperature of the graphene sheet 120 initially increases as described above, and then decreases as the electrons of the graphene sheet 120 lose heat energy through several mechanisms, including coupling through the contacts (e.g., the diagnostic contact 230, and the two superconducting patches 250) coupling to the lattice, and coupling to the electromagnetic environment. As such, after a photon is absorbed, the temperature may increase and then decrease again, and as a result, the critical current 310 may decrease and the increase, and the voltage across the Josephson junction 130 may increase and then decrease, i.e., the Josephson junction 130 may produce a voltage pulse. The voltage pulse may be amplified by an amplifier 135 (FIG. 1), which may have sufficient bandwidth, e.g., a bandwidth of at least 100 MHz, or a bandwidth of 1 GHz or more, to amplify the voltage pulse, which may be of short duration because of the low heat capacity of the electrons of the graphene sheet 120. The amplifier 135 may include a quantum noise limited amplifier followed by a high electron mobility transistor (HEMT) amplifier. The Josephson junction readout may also include a matching network, e.g., an inductor-capacitor (LC) matching network, for transforming the impedance of the Josephson junction 130 to the input impedance of the amplifier 135 (which may be about 50 ohms). In some embodiments the quantum noise limited amplifier may be a radio frequency superconducting quantum interference device (RF SQUID) amplifier, or it may be a travelling wave parametric amplifier, or a tuned system parametric amplifier (TPA), or any other kind of amplifier with a suitable frequency response that is quantum noise limited or nearly quantum noise limited. In some embodiments the amplifier 135 does not include quantum noise limited amplifier, and has a HEMT amplifier as the first stage instead. The behavior of the Josephson junction 130 may be understood as the behavior of a phase particle in a tilted "washboard" potential in the RCSJ model. In some embodiments the Josephson junction 130 may exhibit a behavior referred to as latching on, that may occur when the phase particle remains in a local minimum of the potential, and that may result in the voltage across the junction not returning to zero after the absorption of a photon. In such a case, the readout circuit may be configured to detect latching on (for example, when the duration of a pulse exceeds a threshold), and the readout circuit may then reset the Josephson junction 130 by briefly setting the bias current to zero, causing the Josephson junction to return to a zero-voltage state, in a state change referred to as retrapping. The likelihood that the Josephson junction 130 will exhibit latching on behavior may be affected by the magnitude of the bias current; e.g., a Josephson junction 130 biased with a bias current near the critical current 310 may be more likely to exhibiting latching on behavior than a Josephson junction 130 biased with a bias current well below the critical current 310.

Figure 4:
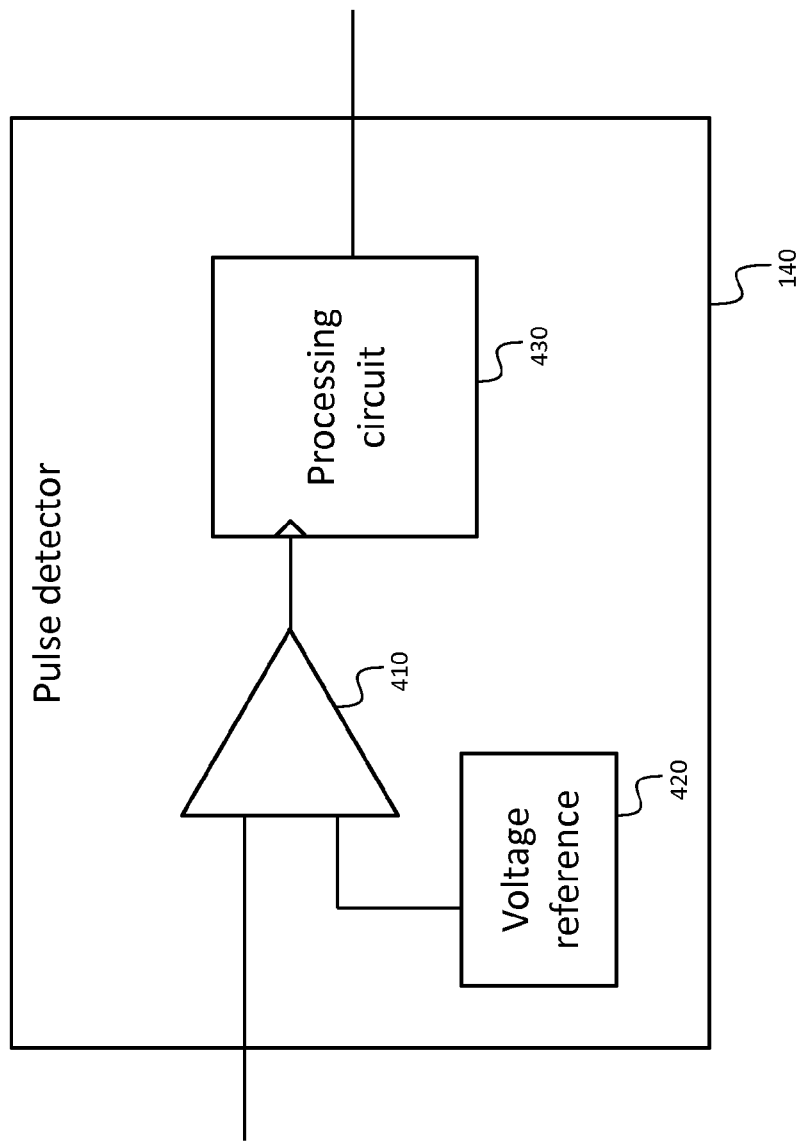
FIG. 4 is a block diagram of a pulse detector according to an embodiment of the present invention.

A pulse detector 140 connected to the Josephson junction 130 may be used to detect the absorbed photons. Referring to FIG. 4, the input to the pulse detector 140 may be a voltage from the output of the Josephson junction 130, which may be zero when no photons have been recently absorbed, and which may exhibit a voltage pulse when a photon is absorbed. The pulse detector 140 may have a set threshold voltage, and it may generate a digital output pulse, or increment a photon count register, each time the input voltage increases past the threshold voltage, i.e., crosses the threshold voltage with a positive time-derivative. For example, the pulse detector 140 may include a comparator 410, one input of which is (or is connected to) the input of the pulse detector 140, a second input of which is connected to a voltage reference 420 that defines the threshold voltage, and the output of which is connected to a digital processing circuit 430. For example the output of the comparator 410 may be connected to the clock input of a flip-flop or other edge-triggered circuit, so that the detection of a photon causes an essentially immediate change of state in the processing circuit 430.

The waveguide 110 may be straight, and, to increase the amplitude of the evanescent waves overlapping the graphene sheet 120, it may be part of an optical resonator, constructed, for example, by forming a reflector (e.g., a Bragg reflector) at each end of a section of the waveguide 110. Bragg reflectors may be formed by creating periodic defects in or adjacent the waveguide 110, e.g., by forming holes in or adjacent the waveguide structure with a focused ion beam. The reflector at the front end of the waveguide 110 (i.e., the end first encountered by the arriving infrared light) may be partially reflective, to allow the infrared light to enter the resonator, and the reflector at the other end (the "back" end) of the waveguide 110 may be highly reflective, to avoid allowing light to escape from the back end of the waveguide 110. In some embodiments only one reflector is used, at the back end of the waveguide 110.

Figure 5:
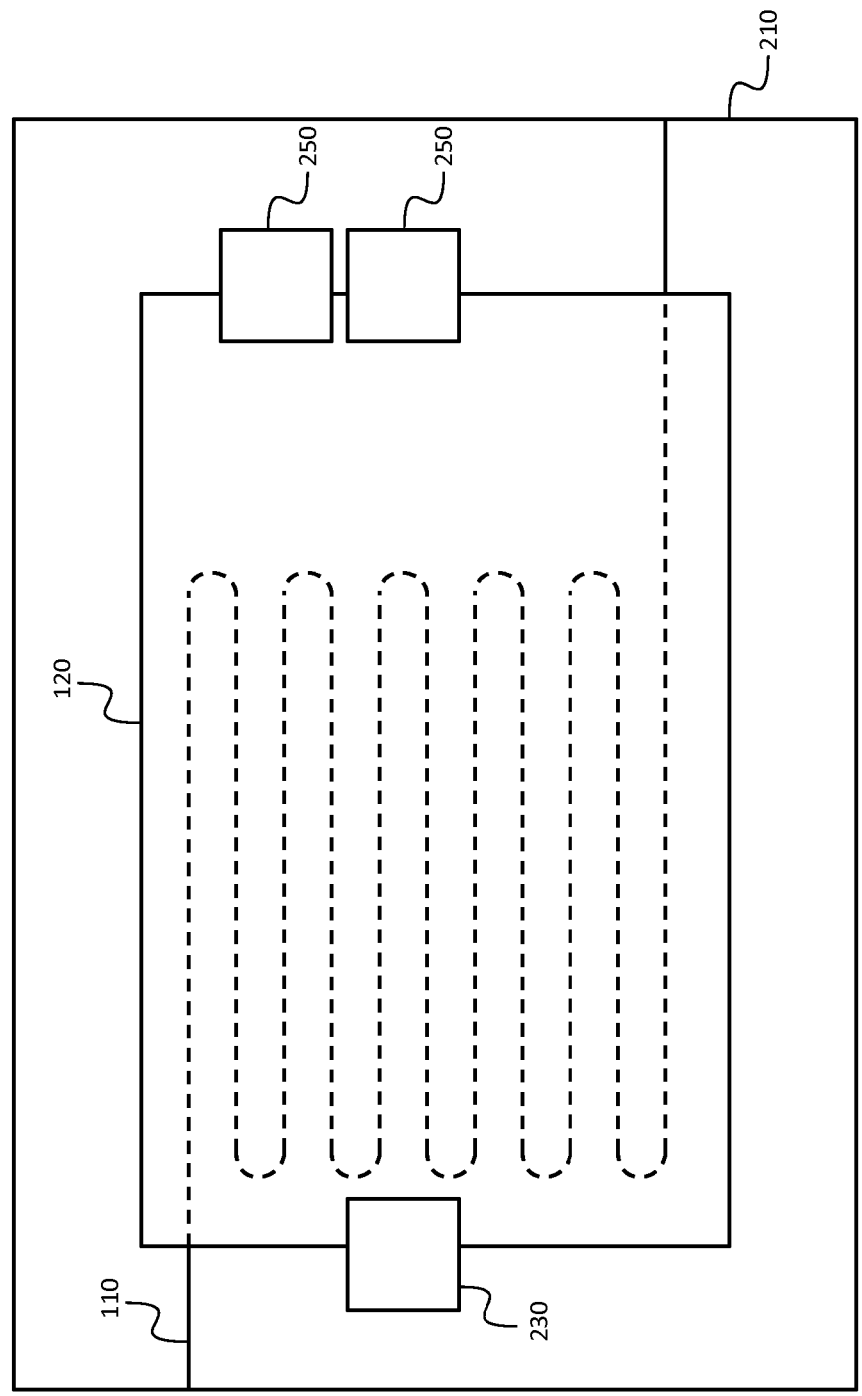
FIG. 5 is a schematic plan view of a sensor assembly according to an embodiment of the present invention.

In other embodiments the waveguide 110 may not be straight, but may have one or more curves, increasing the length of the section of waveguide 110 that is adjacent the graphene sheet 120, and from which evanescent waves may interact with the graphene sheet 120. A curved section in the waveguide may have a radius of curvature less than the length of the graphene sheet 120, and in the curved section the direction of the waveguide may change by 45 degrees or more. The curvature of the waveguide may at all points be sufficiently gradual, e.g., having a radius of curvature exceeding the wavelength in the waveguide, of the infrared light, to avoid excessive loss. The increased length of the section of waveguide 110 adjacent the graphene sheet 120 may increase the probability, for any photon launched into the waveguide 110, of being absorbed by the graphene sheet 120. The waveguide 110 may have a double spiral shape as illustrated in FIG. 2A. In other embodiments the waveguide 110 may have the shape of a single spiral, with the back end of the waveguide in the center of the spiral. The back end of the waveguide 110 may be at an edge of the substrate 210 as illustrated in FIG. 2A, or it may be elsewhere on the substrate 210, e.g., near the middle in the case of a waveguide 110 in the shape of a single spiral. Referring to FIG. 5, in one embodiment the waveguide 110 may have a meandering shape, covering a region under a portion of the graphene sheet 120 as illustrated. In yet other embodiments, the waveguide 110 may have one or more curves and also form part of a resonator, to further increase the absorption probability for photons launched into the waveguide 110.

Figure 6:
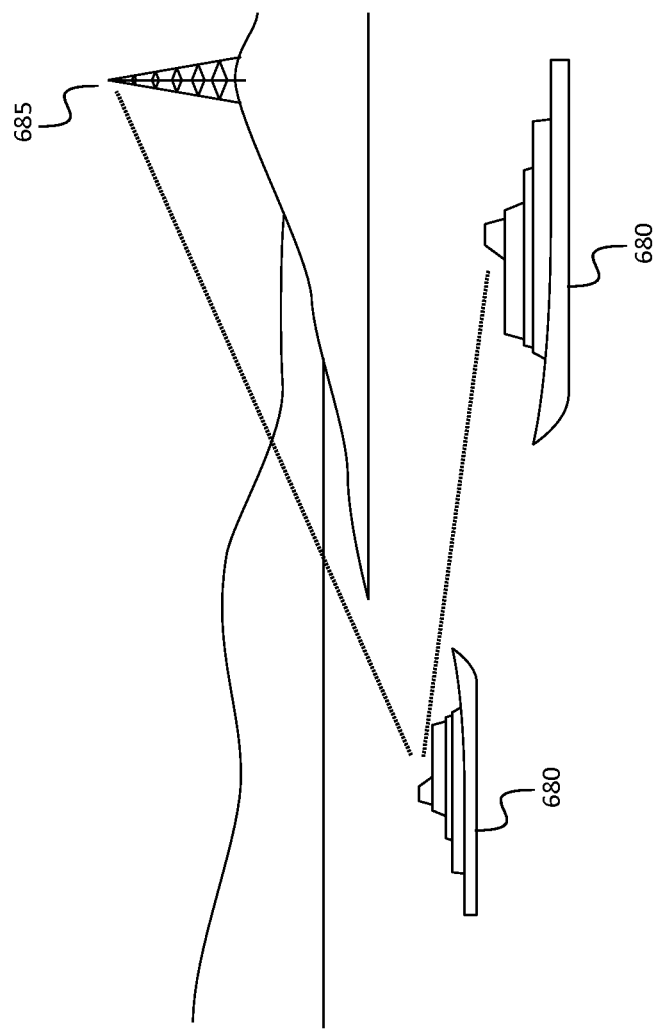
FIG. 6 is a perspective view of a communications system including mobile transceivers according to an embodiment of the present invention.

Infrared light may be launched into the waveguide 110 by any of several systems known to those of skill in the art. For example, if the infrared light to be detected is initially travelling in free space, it may be coupled into the waveguide 110 using one or more suitable powered optics, such as lenses or curved mirrors. Referring to FIG. 6, transceivers using coupling to free-space propagating waves may be used for mobile communications e.g., between ships 680 and a tower 685. If the infrared light to be detected is initially propagating in an optical fiber, it may be launched into the waveguide 110 of the single photon detector using any suitable one of a variety of fiber-to-chip couplers known to those of skill in the art.

Figure 2B:
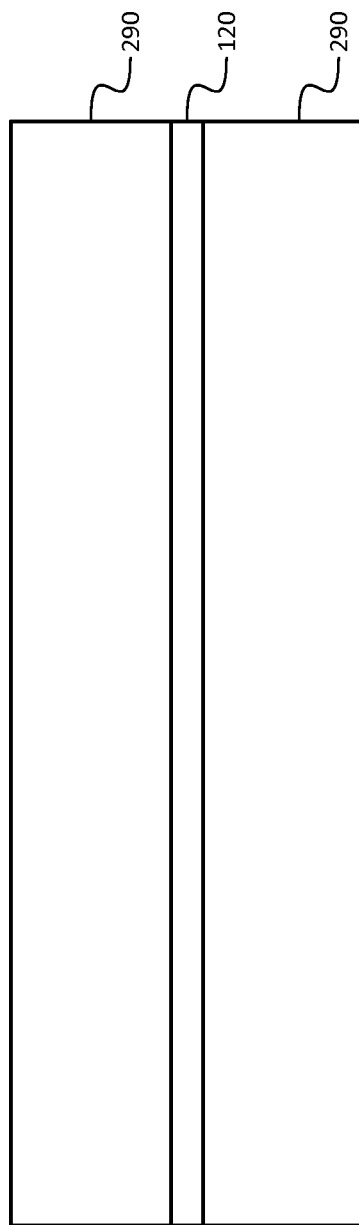
FIG. 2B is a schematic side view of a graphene sheet sandwiched between two layers of hexagonal boron nitride, according to an embodiment of the present invention.

The graphene sheet 120 may be a single-layer sheet, i.e., it may be one atomic layer thick, or it may be a multi-layer graphene sheet 120, having, e.g., 2, 3, 4, or more layers. Referring to FIG. 2B, in one embodiment, the graphene sheet 120 is encapsulated in hexagonal boron nitride (hBN). As is known to those of skill in the art, a sandwich is formed, with the graphene sheet 120 sandwiched between two layers 290 of hexagonal boron nitride. Each layer 290 of hexagonal boron nitride may be between 4 nm and 40 nm thick; these layers 290 of hexagonal boron nitride may keep the surface of the graphene sheet 120 clean, i.e., they may prevent surface contamination from compromising the properties of the graphene sheet 120. The sandwich, composed of the two outer layers 290 of hexagonal boron nitride encapsulating the graphene sheet 120, may then be disposed on the portion of the substrate 210 that includes the waveguide 110.

Each hexagonal boron nitride layer 290 may be a single crystal, with an atomically flat surface facing the graphene sheet 120. Each hexagonal boron nitride layer 290 may be annealed, e.g., at 250° C. for 10-15 minutes, before the sandwich is assembled. The sandwich may be formed by first bringing a first layer 290 of hexagonal boron nitride into contact with the graphene sheet 120, resulting in adhesion of the graphene sheet 120 to the hexagonal boron nitride by van der Waals forces, and then bringing the graphene sheet 120, on the first layer 290 of hexagonal boron nitride, into contact with the second layer 290 of hexagonal boron nitride, resulting in adhesion, again by van der Waals forces, at the interface between the graphene sheet 120 and the second layer 290 of hexagonal boron nitride. The edges of the sandwich may then be etched, e.g. using plasma etching, so that the edges of the two layers 290 of hexagonal boron nitride and the edges of the graphene sheet 120 in the structure remaining after the etch process coincide (i.e., are aligned).

The graphene sheet 120 may be rectangular as illustrated in FIG. 2A, with a length and a width, the length being greater than or equal to the width. The total area of the graphene sheet 120 may be less than 1000 square microns. In one embodiment the graphene sheet 120 is about 10 microns by 10 microns. In one embodiment the graphene sheet 120 has a length in the range 1.0-100.0 microns and a width in the range 1.0-100.0 microns. An electrical contact 230 may be provided at one end of the graphene sheet 120. In one embodiment, contact is made with the edge of the graphene sheet 120, using a layer of metal deposited onto the edge of the sandwich.

For good performance, the graphene sheet 120 may be made as small as possible, kept as clean as possible, and operated at as low a temperature as possible. In one embodiment, the graphene sheet 120 is cooled to 4 K, using, for example, a pulse tube refrigerator or a Gifford-McMahon (GM) cooler. In other embodiments direct cooling with liquid helium, or with liquid helium in a partial vacuum (e.g., using a 1 K pot, to reach temperatures below 4 K) may be used to cool the graphene sheet 120.

Diagnostic circuitry may be connected to two contacts at opposite ends of the graphene sheet 120, e.g., to the diagnostic contact 230 and to one of the superconducting patches 250. The diagnostic circuitry may include components and connections that may be used for diagnostics, e.g., during manufacturing, operation, or service. For example, a bias tee may be used to drive a low-frequency current through the graphene sheet 120, modulating its temperature, and the presence of a corresponding modulation at the output of a power detector measuring the thermal noise (or "Johnson noise") power at radio frequencies or at microwave frequencies may then be used to measure the differential thermal conductance or to verify the functioning of the device generally. The superconducting patches 250 are connected to the graphene sheet 120 electrically but not thermally. The Cooper pairs in superconductors do not conduct heat.

The thermal activation and the macroscopic quantum tunneling of the phase particle of the Josephson junction, both of which may in principle be sources of error, are exponentially suppressed and negligibly small when the bias current and temperature are small and low enough, respectively.

Figure 7:
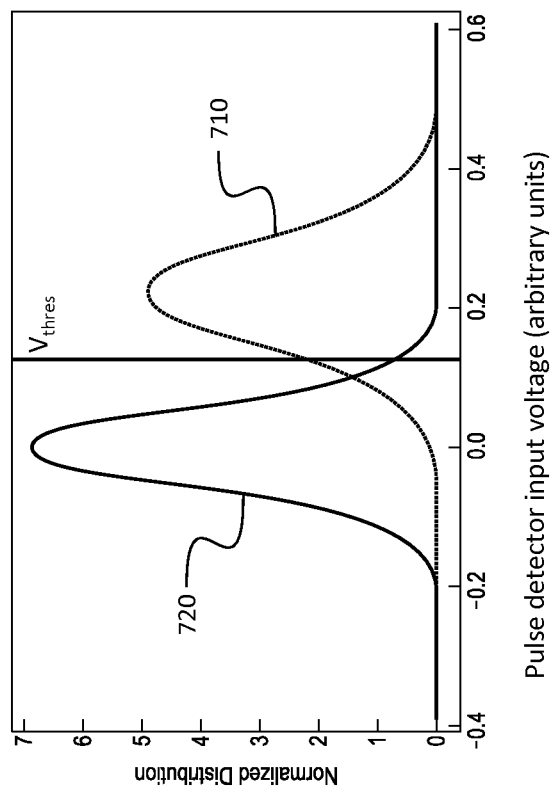
FIG. 7 is a graph of critical current probability distributions according to an embodiment of the present invention.

FIG. 7 shows a first probability distribution 710 of the peak voltage at the input of the pulse detector 140 (e.g., the voltage at the output of the amplifier 135) after a photon is absorbed, and a second probability distribution 720 of the voltage at the input of the pulse detector 140 in the absence of absorbed photons. The threshold voltage ("$V_{thres}$") of the pulse detector 140 may be adjusted to adjust both the dark count rate and the quantum efficiency: if the threshold voltage is increased, the dark count rate and the quantum efficiency are both decreased, because the likelihood that amplifier noise will trigger a count is reduced, and the likelihood that a pulse resulting from the absorption of a photon fail to trigger a count is increased. Conversely, if the threshold voltage is decreased, the dark count rate and the quantum efficiency are both increased, because the likelihood that amplifier noise will trigger a count is increased, and the likelihood that a pulse resulting from the absorption of a photon will trigger a count is also increased.

The greater the separation between the first probability distribution 710, and the second probability distribution 720 (relative to the widths of these distributions), the higher the achievable quantum efficiency for a certain dark count rate will be, or, equivalently, the lower the achievable dark count rate for a certain quantum efficiency will be. The separation between the probability distributions may be affected by the size of the graphene sheet 120, the cleanliness of the graphene sheet 120, and the temperature of the graphene sheet 120 in the absence of absorbed photons. The smaller and cleaner the graphene sheet 120 is, and the lower its temperature, the greater will be the separation between the first probability distribution 710 and the second probability distribution 720. The cleanliness of the graphene sheet 120 may be quantified as an impurity density level, with a cleaner graphene sheet 120 having a lower impurity density level, or as an electron mobility, with a cleaner graphene sheet 120 having a higher electron mobility. In one embodiment a 10 micron by 10 micron square graphene sheet 120 is used, with an impurity density level of $10^9/cm^2$, corresponding to an electron mobility of about 500,000 $cm^2/V/s$. In other embodiments the detector may work adequately with a graphene sheet having significantly lower electron mobility, e.g., electron mobility as low as 1,000 $cm^2/V/s$.

Although limited embodiments of a Josephson junction readout for a graphene-based single photon detector have been specifically described and illustrated herein, many modifications and variations will be apparent to those skilled in the art. Accordingly, it is to be understood that a Josephson junction readout for a graphene-based single photon detector employed according to principles of this invention may be embodied other than as specifically described herein. The invention is also defined in the following claims, and equivalents thereof.

What is claimed is:

1. A photon detector comprising:
   a graphene sheet;
   a waveguide adjacent the graphene sheet, the waveguide configured to guide infrared electromagnetic waves in a mode having an evanescent field coupled to the graphene sheet, to produce an increase in a temperature of the graphene sheet when a photon of the evanescent field is absorbed by the graphene sheet;
   a Josephson junction on the graphene sheet, the Josephson junction having a gap coupled to electrons of the graphene sheet; and
   a circuit connected to two contacts of the Josephson junction, the circuit configured to detect a decrease in a critical current of the Josephson junction, the decrease corresponding to the increase in the temperature of the graphene sheet.

2. The photon detector of claim 1, wherein the graphene sheet has an electron mobility of more than 100,000 $cm^2/V/s$.

3. The photon detector of claim 1, wherein the graphene sheet has an electron mobility of about 1,000 $cm^2/V/s$.

4. The photon detector of claim 1, wherein the graphene sheet substantially has the shape of a rectangle, the rectangle having a length and a width, the length being greater than or equal to the width.

5. The photon detector of claim 4, wherein the length of the rectangle is less than 20 microns.

6. The photon detector of claim 4, wherein the product of the length of the rectangle and the width of the rectangle is less than 1000 square microns.

7. The photon detector of claim 4, wherein the waveguide has a curved section, the curved section having a radius of curvature less than the length of the rectangle, the curved section resulting in a change of direction of the waveguide of at least 45 degrees.

8. The photon detector of claim 1, wherein the waveguide comprises a reflector.

9. The photon detector of claim 1 wherein the waveguide is on a substantially flat substrate, in a layer on a surface of the substrate, the layer having a thickness greater than 10 nanometers and less than 2 microns.

10. The photon detector of claim 1, comprising a first layer of hexagonal boron nitride immediately adjacent a first surface of the graphene sheet, and a second layer of hexagonal boron nitride immediately adjacent a second surface of the graphene sheet.

11. The photon detector of claim 10, wherein each of the first layer of hexagonal boron nitride and the second layer of hexagonal boron nitride has a thickness greater than 4 nm and less than 40 nm.

12. The photon detector of claim 1, wherein the circuit comprises a current source connected to the two contacts of the Josephson junction and configured to drive a constant bias current through the Josephson junction.

13. The photon detector of claim 12, further comprising an amplifier connected to the two contacts of the Josephson junction.

14. The photon detector of claim 13, further comprising a matching circuit connected between the two contacts and the amplifier.

15. The photon detector of claim 14, further comprising a pulse detector connected to the amplifier, the pulse detector comprising a voltage reference and a comparator configured to compare the output of the amplifier to the output of the voltage reference.

16. The detector of claim 1, wherein the graphene sheet consists of a single atomic layer of graphene.

17. The detector of claim 1, wherein the graphene sheet comprises two atomic layers of graphene.

18. The photon detector of claim 1, further comprising a refrigerator configured to cool the graphene sheet to a temperature below 4 K.

19. The photon detector of claim 18, wherein the refrigerator is a pulse tube refrigerator.

20. The photon detector of claim 18, wherein the refrigerator is a Gifford-McMahon cooler.

* * * * *